(12) United States Patent
Stearns et al.

(10) Patent No.: US 12,278,089 B2
(45) Date of Patent: Apr. 15, 2025

(54) PLASMA UNIFORMITY CONTROL SYSTEM AND METHODS

(71) Applicant: Applied Materials, Inc., Santa Clara, CA (US)

(72) Inventors: Michael Andrew Stearns, San Jose, CA (US); Kartik Ramaswamy, San Jose, CA (US); Carlaton Wong, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 18/104,108

(22) Filed: Jan. 31, 2023

(65) Prior Publication Data

US 2024/0258070 A1 Aug. 1, 2024

(51) Int. Cl.
*H01L 21/306* (2006.01)
*H01J 37/32* (2006.01)

(52) U.S. Cl.
CPC ......... *H01J 37/3211* (2013.01); *H01J 37/321* (2013.01); *H01J 37/32174* (2013.01); *H01J 2237/3344* (2013.01)

(58) Field of Classification Search
CPC .............................. H01J 37/321; H01J 37/3211
See application file for complete search history.

(56) References Cited

U.S. PATENT DOCUMENTS

| | | | | |
|---|---|---|---|---|
| 5,907,221 | A | * | 5/1999 | Sato ...................... H01J 37/321 315/111.21 |
| 6,030,667 | A | * | 2/2000 | Nakagawa ............ H01J 37/321 438/758 |
| 9,673,684 | B2 | | 6/2017 | Shaw |
| 9,673,688 | B2 | | 6/2017 | Shaw |
| 9,800,109 | B2 | | 10/2017 | Shaw |
| 9,859,763 | B2 | | 1/2018 | Shaw |

(Continued)

FOREIGN PATENT DOCUMENTS

| | | |
|---|---|---|
| CN | 210984687 U | 7/2020 |
| JP | 2010087182 A | 4/2010 |

(Continued)

OTHER PUBLICATIONS

U.S. Appl. No. 18/107,487, filed Feb. 8, 2023.
Internatinal Search Report / Written Opinion issued to application No. PCT/US2023/078538 on Feb. 29, 2024.

*Primary Examiner* — Luz L Alejandro Mulero
(74) *Attorney, Agent, or Firm* — Patterson + Sheridan, LLP

(57) ABSTRACT

Embodiments of the present disclosure include an apparatus and methods for the plasma processing of a substrate. Some embodiments are directed to a plasma processing chamber. The plasma processing chamber generally includes a planar coil region comprising a plurality of planar coils, a first power supply circuit coupled to at least two of the plurality of planar coils, a concentric coil region at least partially surrounding the planar coil region, and a second power supply circuit coupled to at least two of a plurality of concentric coils. The first power supply circuit may be configured to bias the at least two of the plurality of planar coils to affect a plasma in a center region of the plasma processing chamber, and the second power supply circuit may be configured to bias the at least two of the plurality of concentric coils to affect the plasma in an outer region.

17 Claims, 12 Drawing Sheets

(56) References Cited

U.S. PATENT DOCUMENTS

| | | |
|---|---|---|
| 10,135,310 B2 | 11/2018 | Schuler et al. |
| 10,141,803 B2 | 11/2018 | Schuler et al. |
| 10,141,804 B2 | 11/2018 | Schuler et al. |
| 10,170,953 B2 | 1/2019 | Shaw |
| 10,186,922 B2 | 1/2019 | Schuler et al. |
| 10,211,694 B1 | 2/2019 | Shaw |
| 10,256,690 B2 | 4/2019 | Shaw |
| 10,340,760 B2 | 7/2019 | Schuler et al. |
| 10,680,479 B2 | 6/2020 | Schuler et al. |
| 10,727,712 B2 | 7/2020 | Schuler et al. |
| 10,819,174 B2 | 10/2020 | Schuler et al. |
| 11,005,322 B2 | 5/2021 | Milheim et al. |
| 11,121,614 B2 | 9/2021 | Milheim |
| 11,177,726 B2 | 11/2021 | Schuler et al. |
| 11,183,896 B2 | 11/2021 | Guedes-Pinto et al. |
| 11,201,516 B2 | 12/2021 | Schuler et al. |
| 11,283,319 B2 | 3/2022 | Park et al. |
| 2003/0192644 A1 | 10/2003 | Pu et al. |
| 2013/0160949 A1* | 6/2013 | Sakka ............... H01J 37/321 156/345.48 |
| 2013/0256271 A1* | 10/2013 | Panagopoulos ...... H01J 37/3211 156/345.35 |
| 2013/0278141 A1 | 10/2013 | Dorf et al. |
| 2020/0067361 A1 | 2/2020 | Shaw et al. |
| 2021/0057950 A1 | 2/2021 | Schuler et al. |
| 2021/0135549 A1 | 5/2021 | Lee et al. |
| 2021/0143691 A1 | 5/2021 | Lee et al. |
| 2021/0143696 A1 | 5/2021 | Guedes-Pinto et al. |
| 2021/0143697 A1 | 5/2021 | Lee et al. |
| 2021/0218304 A1 | 7/2021 | Schuler et al. |
| 2021/0226494 A1 | 7/2021 | Milheim et al. |
| 2022/0077739 A1 | 3/2022 | Schuler et al. |
| 2022/0094225 A1 | 3/2022 | Schuler et al. |
| 2022/0277932 A1* | 9/2022 | Yamawaku ............ C23C 16/505 |
| 2022/0329132 A1 | 10/2022 | Guedes-Pinto et al. |

FOREIGN PATENT DOCUMENTS

| | | |
|---|---|---|
| KP | 1020160095303 A | 8/2016 |
| WO | 2022060562 A1 | 3/2022 |
| WO | 2022108753 A1 | 5/2022 |
| WO | 2022159451 A1 | 7/2022 |

* cited by examiner

PLASMA UNIFORMITY CONTROL SYSTEM AND METHODS

BACKGROUND

Field

Embodiments of the present disclosure generally relate to a system used in semiconductor device manufacturing. More specifically, embodiments of the present disclosure relate to a plasma processing system used to plasma process a substrate and methods of using the same.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards two nanometers (nm), the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on a substrate support disposed in a processing chamber, a plasma is formed over the substrate by use of a radio frequency (RF) generator that is coupled to an electrode disposed on or within the plasma processing chamber, and ions are accelerated from the plasma towards the substrate across a plasma sheath. Additionally, RF substrate biasing methods, which require the use of a separate RF biasing source in addition to the RF generator that is used to initiate and maintain the plasma in the processing chamber, have been unable to desirably control the plasma sheath properties to achieve desirable plasma processing results that will allow the formation of these smaller device feature sizes.

However, non-uniformities in the plasma density and/or in the shape of the plasma sheath can occur, due to the variations in the electrical characteristics of and/or spatial arrangement of the processing components disposed within a processing region of a plasma processing chamber. One common plasma density variation is created within conventional inductively coupled plasma sources that include a coil that is positioned over the processing region of a plasma chamber due to the coil being axisymmetric and thus having a magnetic field null point positioned at a central axis of the coil. The variation in plasma will cause undesirable processing results in etched features formed across the surface of the substrate. Excessive variation in plasma non-uniformity will adversely affect the process results and reduce device yield. Such non-uniformities are often particularly pronounced near or between the center and edge of the substrate.

Accordingly, there is a need in the art to control and/or minimize the adverse effects of plasma non-uniformity inside the plasma chamber. There is also a need for a system, device(s), and methods that solve the problems described above.

SUMMARY

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

Embodiments provided herein generally include apparatus, plasma processing systems, and methods for generation of a waveform for plasma processing of a substrate in a processing chamber.

Embodiments of the present disclosure provide a plasma processing chamber. The plasma processing chamber generally include a planar coil region comprising a plurality of planar coils, wherein each of the plurality of planar coils comprise a coil that is disposed between a first end and a second end and has a first portion that is aligned parallel to a first plane, and a first power supply circuit coupled to at least two of the plurality of planar coils. The first power supply circuit may be configured to bias at least two of the plurality of planar coils to affect a plasma formed in a center region of the plasma processing chamber. The plasma processing chamber also generally includes a concentric coil region comprising a first concentric coil and a second concentric coil, wherein at least a portion of the planar coil region is surrounded by the first concentric coil and the second concentric coil, the first concentric coil comprises a first coil that has a first diameter that is measured in a direction parallel to the first plane, the second concentric coil comprises a second coil that has a second diameter that is measured in a direction parallel to the first plane, and the first diameter is smaller than the second diameter. The plasma processing chamber also generally includes a second power supply circuit coupled to at least two of the at plurality of concentric coils, wherein the second power supply circuit is configured to bias the first concentric coil and the second concentric coil to alter a characteristic of the plasma formed in an outer region of the plasma processing chamber.

Embodiments of the present disclosure provide a method of processing a substrate. The method of processing a substrate generally includes performing a processing sequence on the substrate disposed within a processing region of a plasma processing chamber. The processing sequence generally includes biasing at least two of a plurality of planar coils disposed within a planar coil region by use of a first power supply circuit, and each of the plurality of planar coils comprise a coil that is disposed between a first end and a second end and has a first portion that is aligned parallel to a first plane, wherein the biasing the at least two of the plurality of planar coils comprises: delivering a first bias signal to a coil of a first planar coil of the plurality of planar coils; and delivering a second bias signal to a coil of a second planar coil of the plurality of planar coils, and the biasing the at least two of the plurality of planar coils is configured to alter a characteristic of a plasma formed in a center region of the plasma processing chamber. The processing sequence also generally includes biasing at least two of the plurality of planar coils disposed within the planar coil region by use of the first power supply circuit, wherein the biasing the at least two of the plurality of planar coils comprises: delivering a third bias signal to a coil of a third planar coil of the plurality of planar coils; and delivering a fourth bias signal to a coil of a fourth planar coil of the plurality of planar coils, and the biasing the at least two of the plurality of planar coils is configured to alter a characteristic of a plasma formed in a center region of the plasma processing chamber.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

Figure 1:
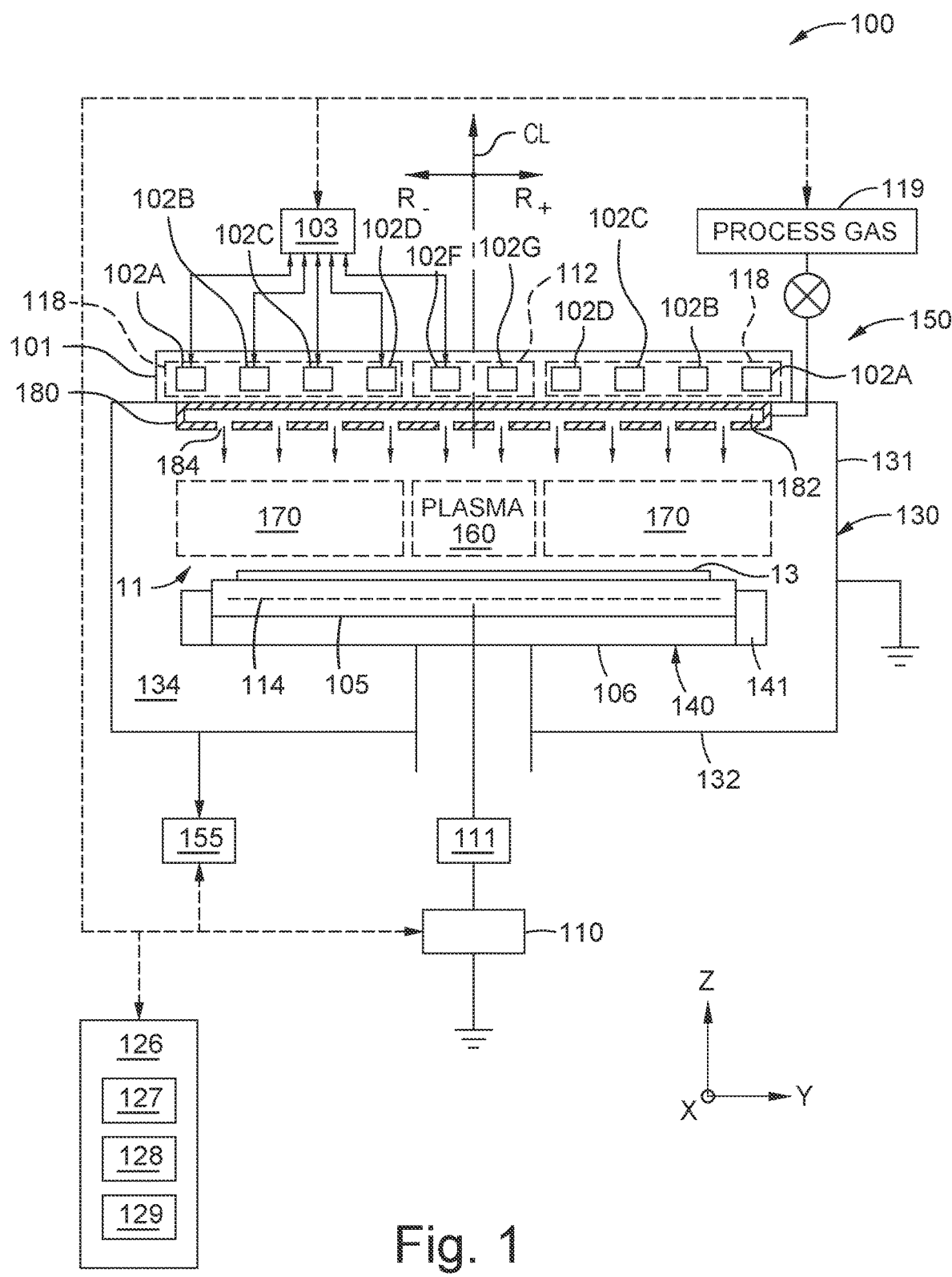
FIG. 1 is a simplified schematic side cross-sectional view of a plasma processing system that can be configured to practice the methods set forth herein, in accordance with certain embodiments of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

In the following description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the term "about" may refer to a +/−10% variation from the nominal value. It is to be understood that such a variation can be included in any value provided herein.

Embodiments of the present disclosure generally relate to a system that can be used in a semiconductor device manufacturing process sequence. More specifically, embodiments provided herein generally include apparatus and methods for controlling and synchronizing the delivery of magnetic fields generated from a field generation system disposed within a plasma processing chamber. The apparatus and methods disclosed herein can be useful to at least minimize or eliminate the effects of plasma non-uniformity on a substrate. The plasma processing methods and apparatus described herein are configured to improve the control of various characteristics of the generated plasma and control an ion energy distribution (IED) of the plasma generated ions that interact with a surface of a substrate during plasma processing. The ability to synchronize and control the magnetic fields generated from a field generation system during processing allows for an improved control of one or more characteristics of the generated plasma, such as plasma uniformity, plasma density, IED, electron energy distribution (EED) or other useful parameter. The improved control of the plasma is used to improve the plasma processing results performed in the plasma processing chamber, for example, forming desirable high-aspect ratio features in the surface of the substrate by a reactive ion etching process. As a result, greater precision for plasma processing can be achieved, which is described herein in more detail.

Embodiments of the present disclosure provide an apparatus and method for controlling the fields generated by one or more coils in a field generation system of a plasma processing system in order to achieve greater precision during plasma processing.

Plasma Processing System Example

FIG. 1 is a simplified schematic of a plasma processing system 100 that can be configured to practice the methods set forth herein. In FIG. 1 and subsequent figures in the present disclosure, CL represents the center line of the plasma processing system 100, R− represents the negative radial direction, and R+ represents the positive radial direction. The plasma processing system 100 is adapted to process a substrate 13 disposed on a substrate support assembly 140 by generating a plasma 11 within the processing volume 134 of a plasma processing chamber 150. The plasma 11 may include a number of regions of the formed plasma. In some embodiments, the formed plasma 11 may include a center region 160, which may be surrounded by an outer region 170. The plasma processing system 100 is configured to form an inductively coupled plasma (ICP), where the processing chamber 150 includes a field generation system 101 disposed over a portion of the processing volume 134 so that at least a portion of the field generation system 101 is facing a biasing electrode 114. The biasing electrode 114 is disposed within substrate support assembly 140 that is disposed within the processing volume 134. The biasing electrode 114 is also often referred to herein as a substrate support electrode, and may be coupled to a generator 110.

Figure 2:
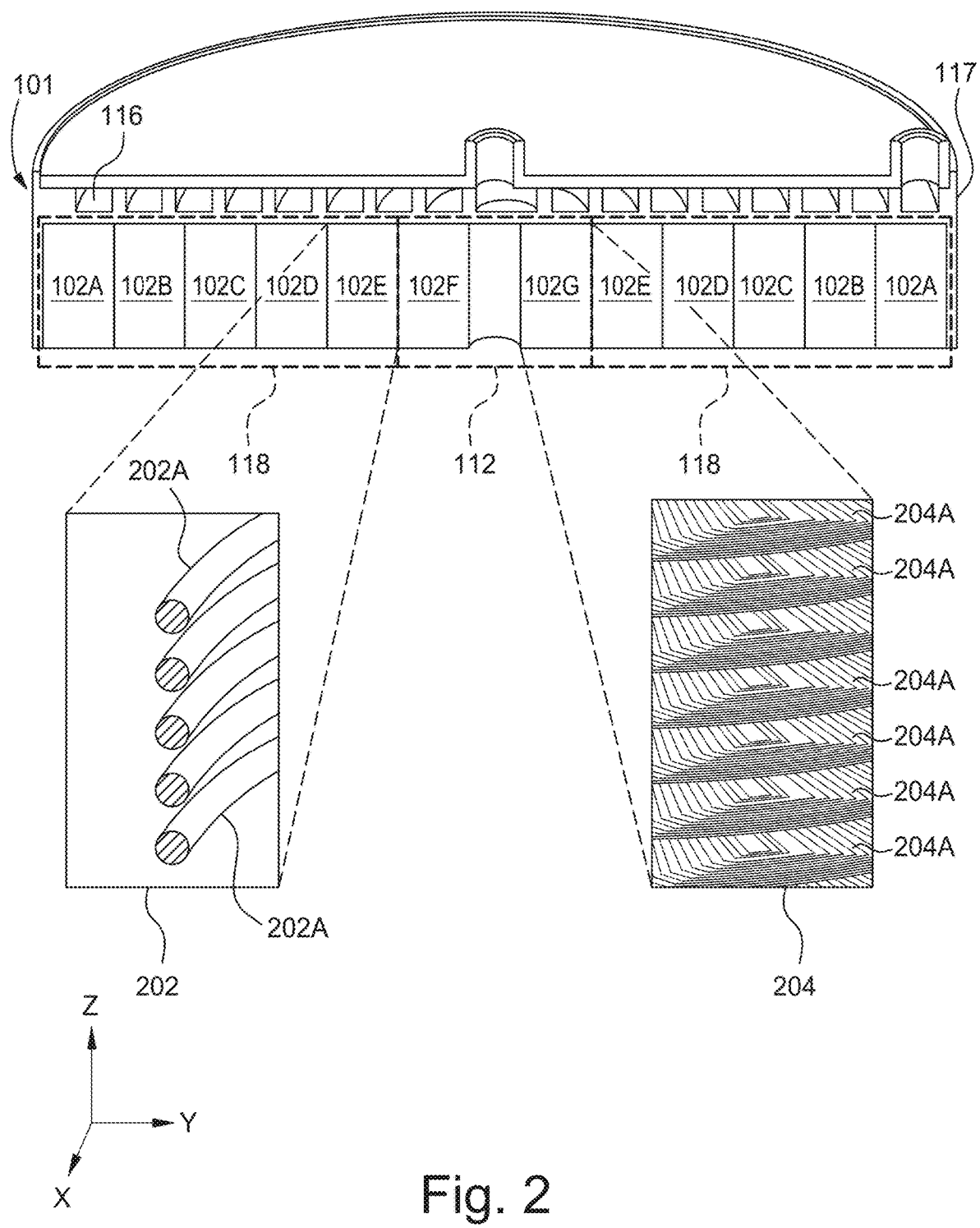
FIG. 2 is a schematic side cross-sectional isometric view of a field generation system, according to one or more embodiments, in accordance with certain embodiments of the present disclosure.
Figure 3:
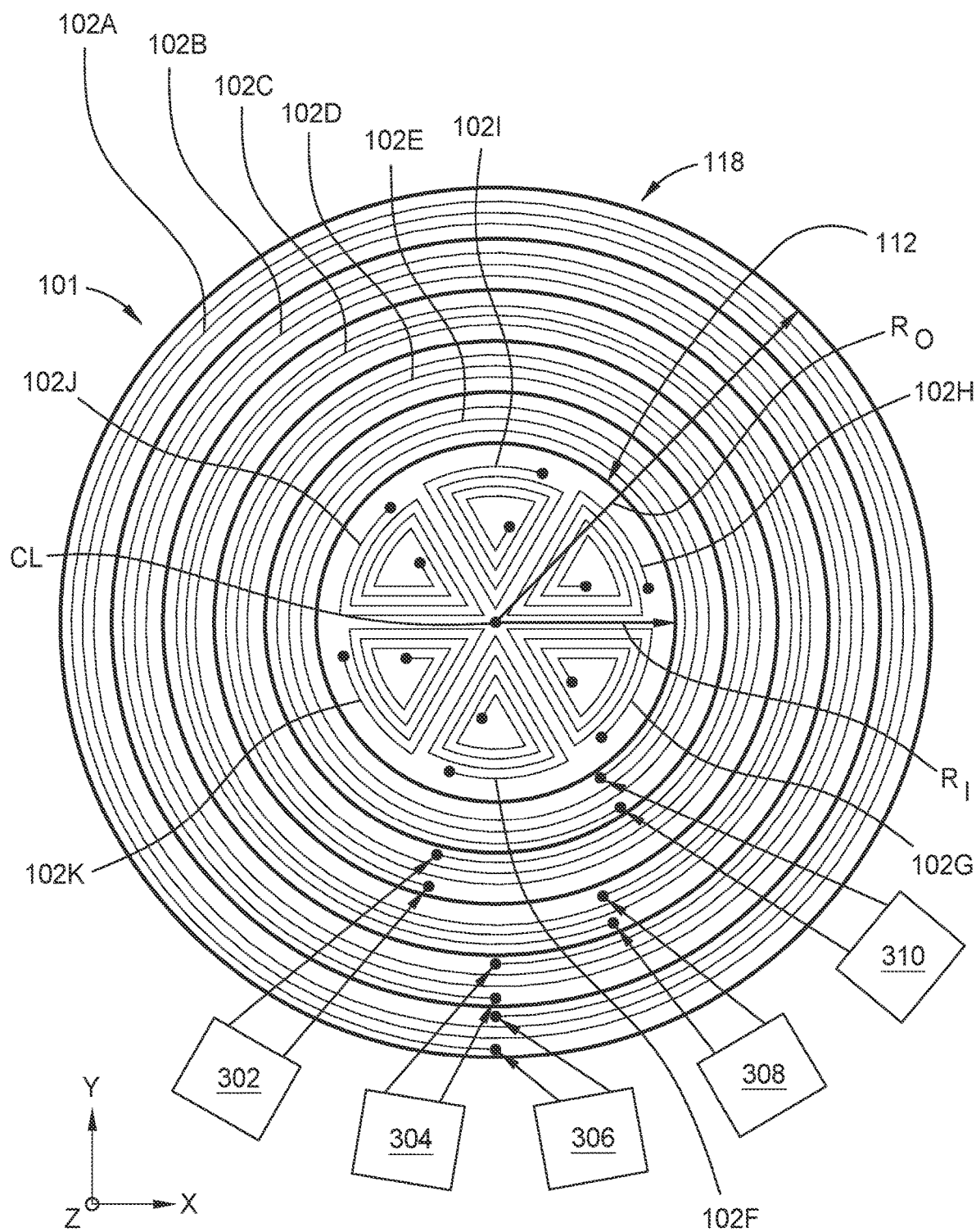
FIG. 3 is a schematic bottom view of a field generation system, in accordance with certain embodiments of the present disclosure.

In some embodiments, the field generation system 101 includes one or more planar coils (e.g., radial coils 102F, 102G) in a planar coil region 112. The field generation system 101 also includes one or more concentric coils (e.g., concentric coils 102A, 102B, 102C, 102D) in a concentric coil region 118. The one or more concentric coils are circular and may form a ring around and surround the one or more radial coils, as illustrated in FIG. 3. At least one of the one or more concentric coils may be a solenoid type of coil. The one or more planar coils may be disposed above the plasma 11 in the center region 160, and the one or more concentric coils may be disposed above the plasma 11 in the outer region 170. The planar coils and the concentric coils may be coils which include multiple coil layers, as illustrated in FIG. 2. Although four concentric coils and two planar coils are shown in the example of FIG. 1, any number of concentric and planar coils may be used. In some embodiments, the field generation system 101 may be coupled to a power delivery system 103. The power delivery system 103 may include a power supply circuit assembly with a separate driver for each concentric coil and planar coil, each driver being configured to bias (e.g., drive) the concentric coils and planar coils. Alternatively, the power delivery system 103 may include a power supply circuit assembly which includes a first power supply circuit and a second power supply circuit. The power supply circuit assembly may include fewer drivers than concentric and planar coils, such that one driver may be configured to bias multiple coils.

The processing chamber 150 typically includes a chamber body 130 that includes one or more sidewalls 131 and a chamber base 132, which collectively, with a chamber lid 133, define the processing volume 134. The one or more sidewalls 131 and chamber base 132 generally include materials that are sized and shaped to form the structural support for the elements of the processing chamber 150 and are configured to withstand the pressures and added energy applied to them while a plasma 11 is generated within a vacuum environment maintained in the processing volume 134 of the processing chamber 150 during processing. In one example, the one or more sidewalls 131 and chamber base 132 are formed from a metal, such as aluminum, an aluminum alloy, or a stainless steel alloy.

In some embodiments, the field generation system 101 is coupled to or disposed on a shower head 180. The shower head 180 includes a gas plenum region 182 and a number of openings 184. The shower head 180 is disposed through the chamber lid 133 and is used to deliver one or more processing gases through the openings 184 to the processing volume 134 from a processing gas source 119 that is in fluid communication therewith. The processing gases provided by the processing gas source 119 will include reactive etchant gases and inert gases. The pressure within the processing chamber 150 may be controlled by use of a vacuum pump (not shown) and an amount of gas flow provided from the processing gas source 119. A substrate 13 is loaded into, and removed from, the processing volume 134 through an opening (not shown) in one of the one or more sidewalls 131, which is sealed with a slit valve (not shown) during plasma processing of the substrate 13. The shower head 180 is comprised of materials with a low magnetic permeability, such that biasing the planar and concentric coils in the field generation system 101 generates magnetic fields that can affect the plasma 11 in the center region 160 and outer region 170 of the processing volume 134. For example, the shower head 180 may be a metallic plate, and may comprise aluminum, quartz or other materials with a low magnetic permeability.

In some embodiments, the generator 110 may be a pulsed voltage (PV) waveform generator, which is electrically coupled to the biasing electrode 114 through an RF filter 111 that is configured to prevent RF signals from making their way to the generator 110 during processing. The generator 110 may also be an RF source generator, which is electrically coupled to the biasing electrode 114 through an RF filter 111, and may deliver an RF signal configured to ignite and maintain a plasma (e.g., the plasma 11).

The substrate support assembly 140 can include a substrate support 105 (e.g., ESC substrate support) and one or more biasing electrodes, which are coupled to the generator 110. In some embodiments, the substrate support assembly 140 can additionally include a support structure 106 that includes a support base, which supports the substrate support 105, an insulator plate (not shown) and a ground plate (not shown) that is coupled to the chamber base 132. The support base is electrically isolated from the chamber base 132 by the insulator plate, and the ground plate is interposed between the insulator plate and the chamber base 132. A dielectric containing isolation ring 141 is typically positioned around the substrate support 105, the insulator plate and the ground plate. The substrate support 105 is thermally coupled to and disposed on the support base, which is configured to regulate the temperature of the substrate support 105 during processing.

Typically, the substrate support 105 is formed of a dielectric material, such as a bulk sintered ceramic material, such as a corrosion-resistant metal oxide or metal nitride material. In embodiments herein, the substrate support assembly 140 further includes the biasing electrode 114 embedded in the dielectric material thereof. In one configuration, the biasing electrode 114 is a chucking pole used to secure (i.e., chuck) the substrate 13 to the substrate supporting surface of the substrate support assembly 140 and to bias the substrate 13 with respect to the processing plasma 11 using one or more of the pulsed-voltage biasing schemes described herein. Typically, the bias electrode 114 is formed of one or more electrically conductive parts, such as one or more metal meshes, foils, plates, or combinations thereof. In some embodiments, the biasing electrode 114 is also electrically coupled to a clamping network that is configured to provide a chucking voltage thereto, such as static direct current (DC) voltage between about −5000 V and about +5000 V.

A system controller 126, also referred to herein as a processing chamber controller, includes a central processing unit (CPU) 127, a memory 128, and support circuits 129. The system controller 126 is used to control the process sequences and methods used to process the substrate 13, including the substrate 13 processing methods described herein. The CPU 127 is a general-purpose computer processor configured for use in an industrial setting for controlling the processing chamber and sub-processors related thereto. The memory 128 described herein, which is generally non-volatile memory, may include random access memory, read-only memory, floppy or hard disk drive, or other suitable forms of digital storage, local or remote. The support circuits 129 are conventionally coupled to the CPU 127 and comprise cache, clock circuits, input/output subsystems, power supplies, and the like, and combinations thereof. Software instructions (software program) and data can be coded and stored within the memory 128 for instructing a processor within the CPU 127. A software program (or computer instructions) readable by CPU 127 in the system controller 126 determines which tasks are performable by the components in the processing system 100. Typically, the software program, which is readable by CPU 127 in the system controller 126, includes code, which, when executed by the processor (CPU 127), performs tasks relating to the plasma processing methods described herein. The program may include instructions that are used to control the various hardware and electrical components within the processing chamber 150 and processing system 100 to perform the various process tasks and various process sequences used to implement the methods described herein.

In one or more of the embodiments disclosed herein, the processing chamber 150 includes a sensor assembly (not shown) that is positioned to measure characteristics of the PV waveform generated at the source generator 110 output and/or RF waveform generated by the power delivery system 103 output. The sensor assembly can include one or more electrical components that are configured to measure one or more electrical characteristics of the asymmetric voltage waveform provided by the source generator 110, such as voltage, current and offset/phase, and send the one or more electrical characteristic data to the system controller 126. The electrical characteristic data received by the system controller 126 from the source generator 110 can be used together to synchronize the delivery of other PV waveforms generated by the generator 110 and power delivery system 103, as is discussed further below.

The system controller 126 and supporting circuitry are configured to control and/or adjust the voltage waveforms generated by the source generators 110. The source generators 110, system controller 126 and supporting circuitry are able to adjust multiple electrical parameters that are used to alter one or more of the voltage waveform characteristics, such as frequency, waveform shape, and applied voltage on-time during a pulse period of a provided asymmetric voltage waveform.

While the disclosure provided herein, primarily discusses the use of the processing system 100 to perform a plasma-assisted etching processes, such as a reactive ion etch (RIE) plasma processing technique this configuration is not intended to limit the scope of disclosure provided herein. It should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

Field Generation System Example

FIG. 2 is a schematic side cross-sectional view of an example field generation system 101. As described above, the field generation system 101 includes a planar coil region 112 and a concentric coil region 118. In some embodiments, the field generation system 101 may include a number of coolant channels 116 disposed above the planar coil region 112 and the concentric coil region 118 in configured to cool the coils in the planar coil region 112 and a concentric coil region 118. The coolant channels 116 can be formed in a plate 117 that includes a high magnetic permeability material, such as an iron containing material, cobalt containing material, steel, ferrite or other similar material. The planar coil region 112 may include a plurality of planar coils (e.g., radial coils 102F-102K (FIG. 3)), and the concentric coil region 118 may include one or more concentric coils (e.g., concentric coils 102A, 102B, 102C, 102D, 102E). The one or more concentric coils in the concentric coil region 118 may each comprise a coil 202A that is formed into a plurality coil layers (e.g., multi-layer concentric coil 202 illustrated in FIG. 2), and each of the radial coils 102F-102K within the plurality of planar coils 204 may include a coil 204A that is formed in a planar coil pattern that are stacked into multiple planar coil layers (e.g., multi-layer planar coil 204 illustrated in FIG. 2). In general, as illustrated in FIGS. 2-5 and 9-12, the a planar coil region 112 will include a plurality of radial coils that each include a coil 204A that is wound in a direction that is aligned parallel to a first plane, such as the X-Y plane. In some embodiments, as illustrated in FIG. 2, each radial coil includes a plurality of coil layers (e.g., seven coil layers shown) that each include a coil 204A that is aligned parallel to the first plane.

The number of layers utilized in each coil region 112, 118 in the field generation system 101 may be adjusted in order to produce the desired magnetic field, which can include radial and azimuthal field components. As stated above, the one or more concentric coils are circular and may form a ring around and surround the one or more radial coils, as illustrated in FIG. 3. Although five concentric coils and two planar coils are shown in the example of FIG. 2, any number of concentric and planar coils may be used.

FIG. 3 is a schematic bottom view of the field generation system 101 illustrated in FIGS. 1 and 2. As described above, the field generation system 101 include a planar coil region 112 and a concentric coil region 118. In the example of FIG. 3, the planar coil region 112 includes six planar coils (e.g., radial coils 102F, 102G, 102H, 102I, 102J, 102K), and the concentric coil region 118 may include five concentric coils (e.g., concentric coils 102A, 102B, 102C, 102D, 102E). The planar coils in the planar coil region 112 may be radially patterned coils. As stated above with respect to FIG. 2, the concentric coils may each comprise a coil that is wound to form multiple coil 202A layers, and the planar coils may also comprise multiple coil 204A layers. Although five concentric coils and six planar coils are shown in the example of FIG. 3, any number of concentric and planar coils may be used. For schematic representation and ease of illustration purposes, the coils illustrated within the concentric coils 102A-102F are shown as being wound such that they have a planar orientation (e.g., X-Y plane). However, as noted above and below, it is desirable for the concentric coils 102A-102E to be wound such that the coils have a spiral or helical orientation that is primarily and substantially aligned about a central axis CL that is aligned in the vertical direction (e.g., Z-direction).

In some embodiments, the concentric coil region 118 has an inner radius $R_I$ and an outer radius $R_O$. The inner radius $R_I$ of the concentric coil region 118 is defined by the inner radius of an innermost concentric coil, such as concentric coil 102E in FIG. 3, and the outer radius $R_O$ is defined by the outer radius of the outermost concentric coil, such as concentric coil 102A in FIG. 3. In some embodiments, the radial coils within the planar coil region 112 are disposed within a region that is defined by the inner radius $R_I$ of the concentric coil region 118. The inner radius $R_I$ of the concentric coil region 118 can be between about 40 millimeters (mm) and about 100 mm in size. In one example, the inner radius $R_I$ of the concentric coil region 118 is about 50 mm in size, while the outer radius $R_O$ of the concentric coil region 118 is equal to or greater than the radius of the outer edge of the substrate 13, such as, for example, greater than or equal to 300 mm or 450 mm. In some embodiments, the outer radius $R_O$ of the concentric coil region 118 can be less than the radius of the outer edge of the substrate 13, such as, for example, less than 300 mm. In some embodiments, the planar coil region 112 and the concentric coil region 118 are sized such that the field generation system 101 includes a planar coil region ratio (i.e., inner radius $R_I$/outer radius $R_O$) that is between about 0.1 and about 0.4, such as between about 0.1 and about 0.35.

Figure 9:
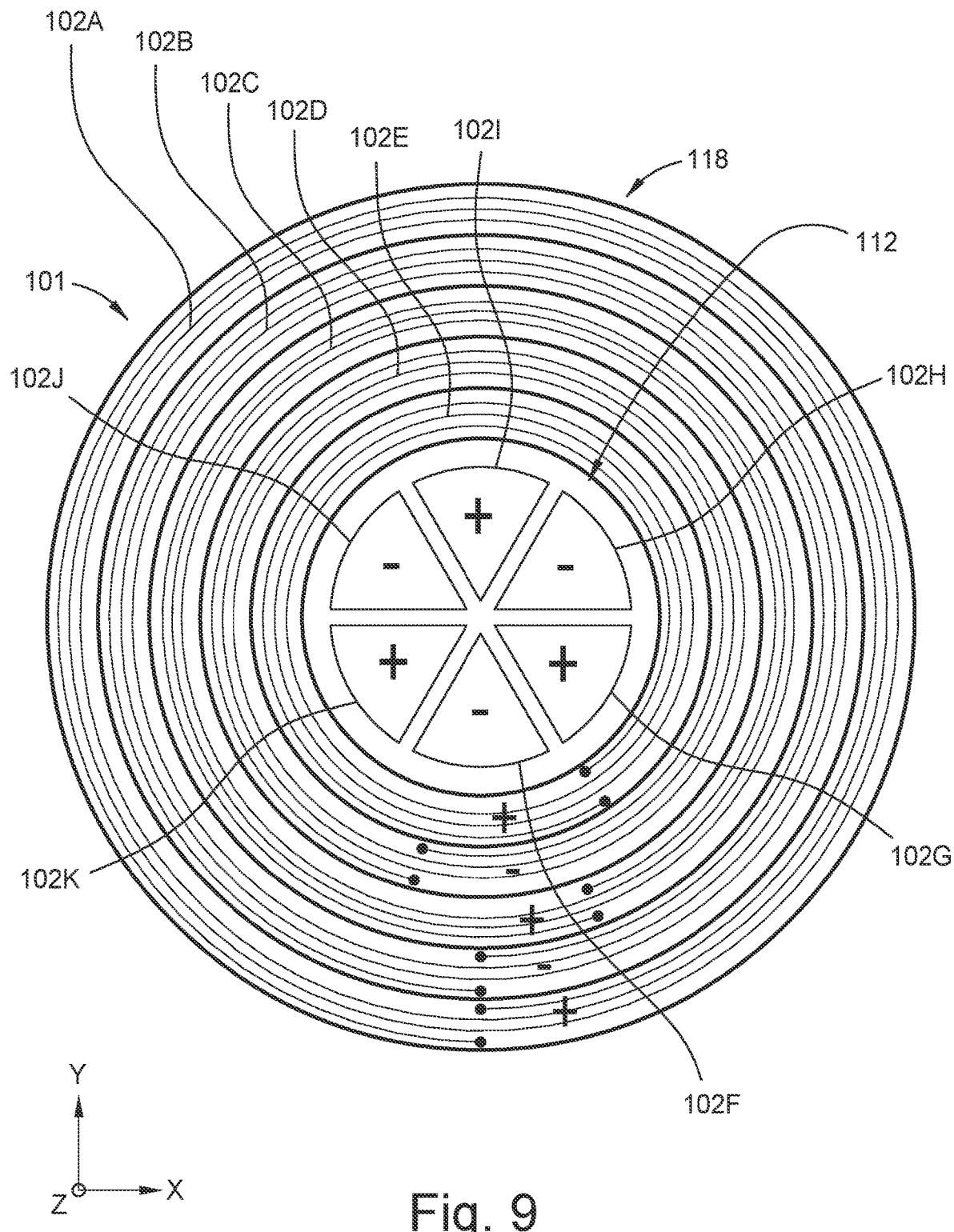
FIG. 9 is a schematic bottom view of a field generation system during a plasma processing sequence, in accordance with certain embodiments of the present disclosure.
Figure 10:
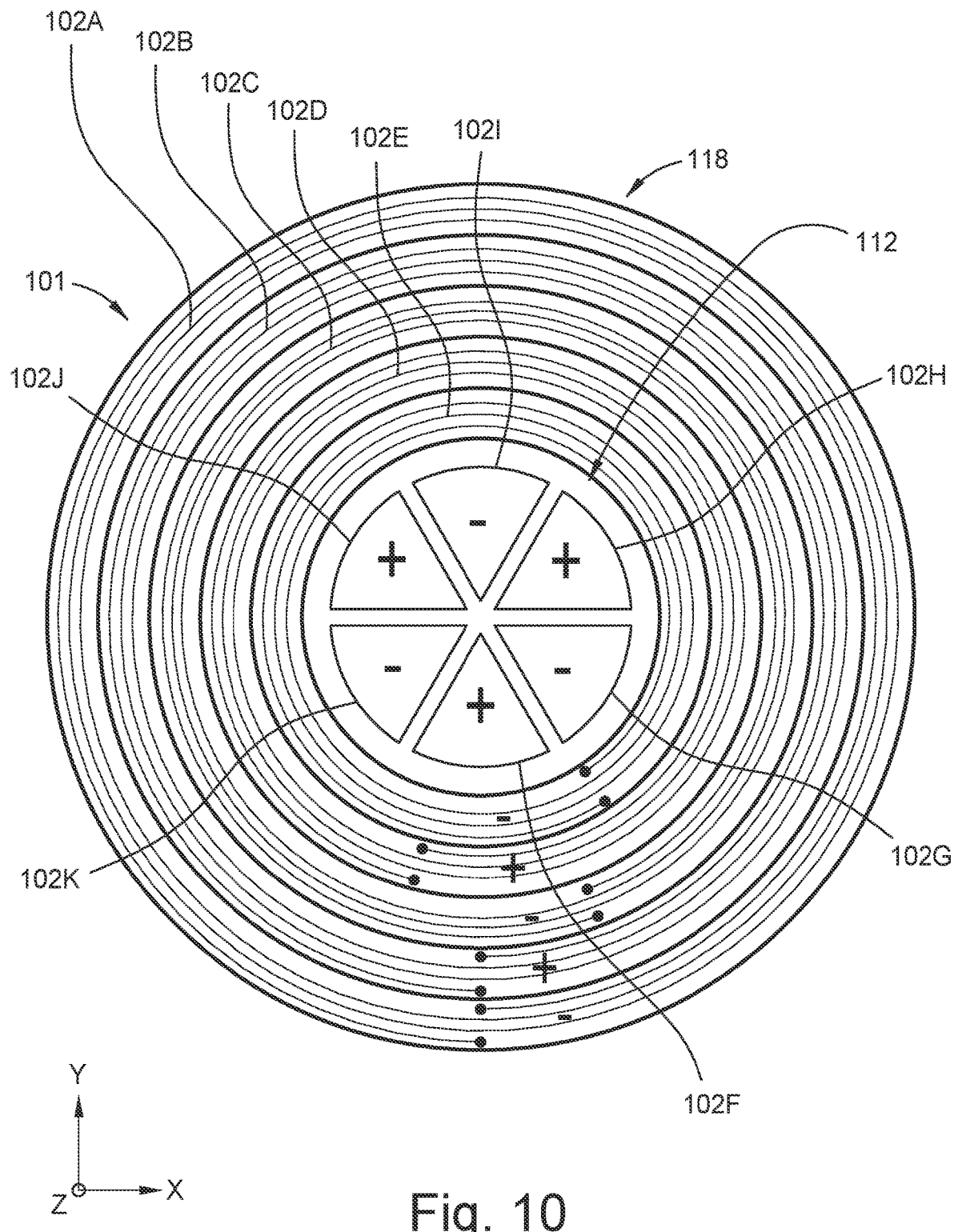
FIG. 10 is a schematic bottom view of a field generation system during a plasma processing sequence, such as a processing sequence performed on a substrate disposed within a processing region of a plasma processing chamber, in accordance with certain embodiments of the present disclosure.

In some embodiments, each of the coils in the coil regions in the concentric coil region 118 may be coupled to a source driver (e.g., source drivers 302, 304, 306, 308, 310), which are included in a power supply circuit assembly of the power delivery system 103. Each source driver may be configured to selectively bias adjacent concentric coils in the same or in opposing directions (e.g., positive and negative directions), as illustrated in FIGS. 9 and 10.

Planar Coil Region Example

Figure 4:
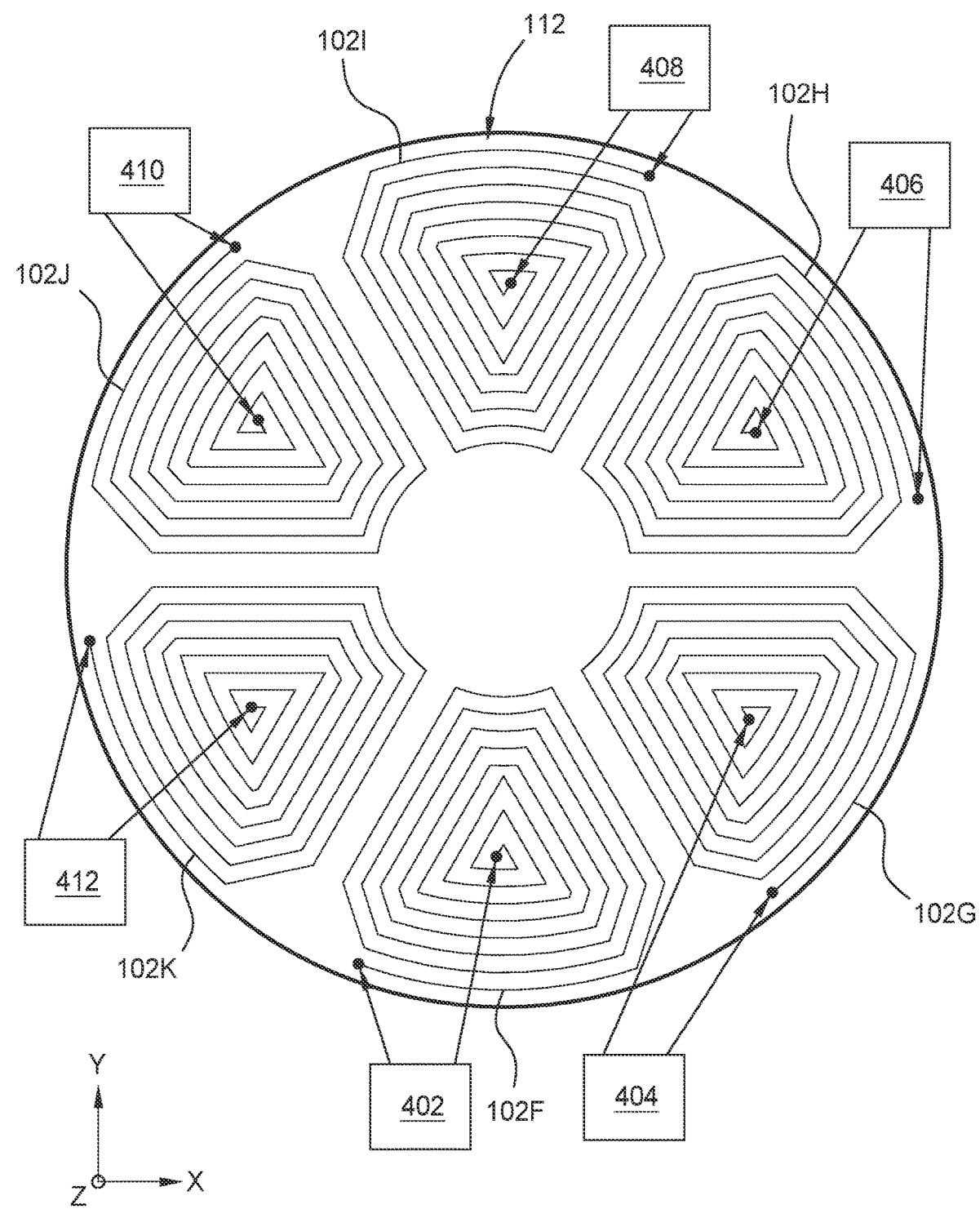
FIG. 4 is a schematic bottom view of an example planar coil region of a field generation system, in accordance with certain embodiments of the present disclosure.

FIG. 4 is a schematic bottom view of a planar coil region 112 of a field generation system 101. In the example of FIG. 4, the planar coil region 112 includes six planar coils (e.g., radial coils 102F, 102G, 102H, 102I, 102J, 102K). As illustrated in FIG. 4, adjacent coils in the planar coil region 112 may be wound in the same direction, but biased by a driver of the source driver 404-412 oppositely such that adjacent radial coils produce oppositely oriented magnetic fields when biased by a source driver 404-412. Alternatively, adjacent coils in the planar coil region 112 may be wound in an opposite manner such that adjacent radial coils produce oppositely oriented magnetic fields when biased by a driver 404-412. In one example, a first coil is wound in a clockwise orientation and an adjacent coil (e.g., second coil) is wound in an anti-clockwise orientation, such that the adjacently positioned coils produce oppositely oriented magnetic fields when powered.

In some embodiments, each of the coils in the planar coil region 112 are coupled to a source driver, such as source drivers 402, 404, 406, 408, 410, 412, which are included in a power supply circuit assembly disposed within the power delivery system 103. Each source driver may be configured to bias adjacent planar coils in opposite directions (e.g., positive and negative directions), as illustrated in FIGS. 9 and 10.

In some embodiments, the coils in the planar coil region 112 may utilize other winding configurations. For example, adjacent pairs of coils in the planar coil region 112 may be wound in the same direction, such that each coil in a pair of adjacent coils is wound in the same manner, and adjacent pairs of coils are wound in an opposite manner (e.g., a first coil pair is wound in a clockwise orientation and the adjacent coil pairs are wound in an anti-clockwise orientation). In another example, coils in the planar coil region 112 may be wound such that adjacent coils in the planar coil region 112 are not coupled together, and each coil is wound independently from any other coil in the planar coil region 112.

Figure 5:
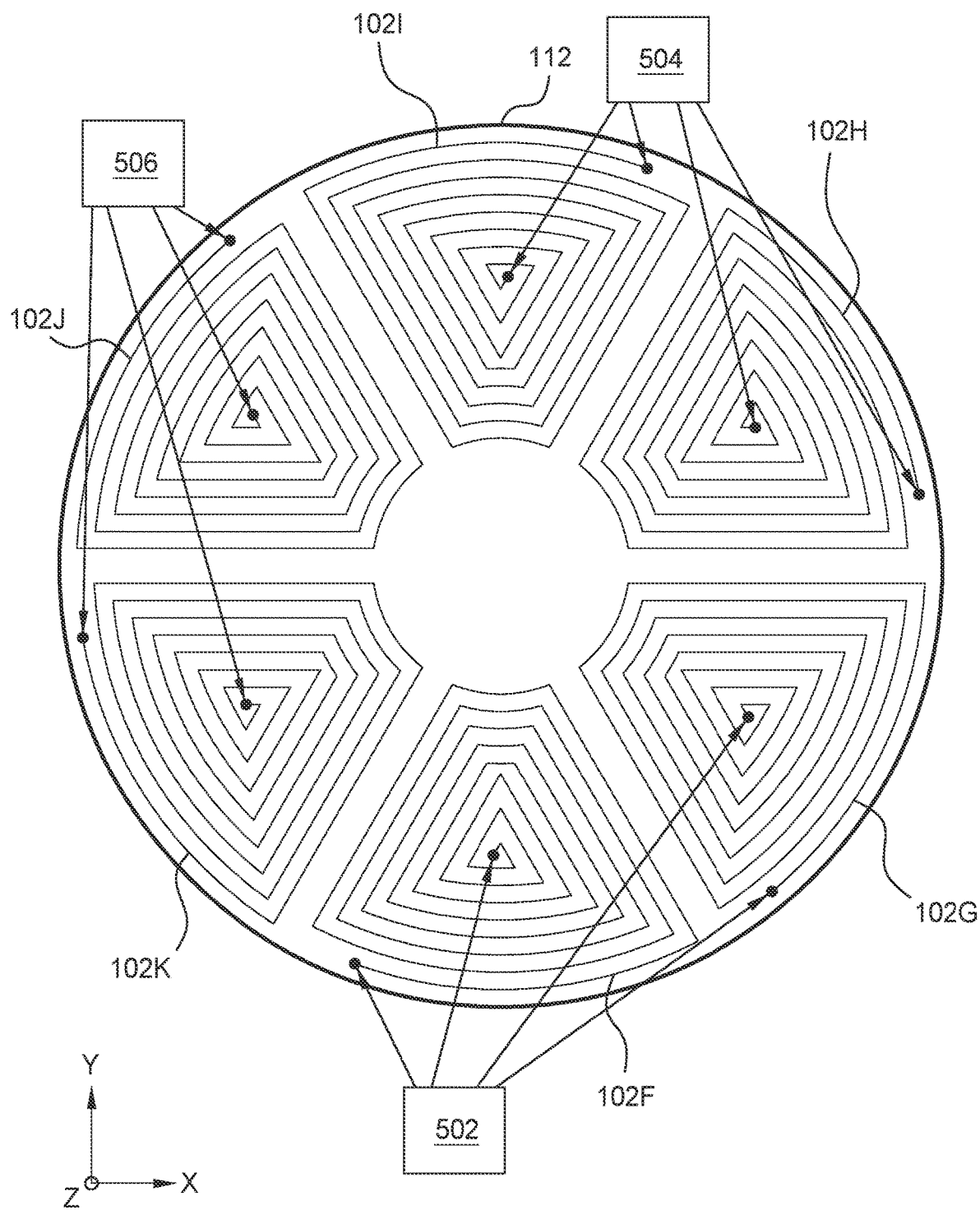
FIG. 5 is a schematic bottom view of an example planar coil region of a field generation system, in accordance with certain embodiments of the present disclosure.

FIG. 5 is a schematic bottom view of an example planar coil region 112 of a field generation system 101. In the example of FIG. 5, the planar coil region 112 includes six planar coils (e.g., radial coils 102F, 102G, 102H, 102I, 102J, 102K) that are similarly wound (e.g., wound in a counter-clockwise direction). Although six planar coils are shown in the example of FIG. 5, any number of planar coils may be used.

In some embodiments, two coils in the planar coil region 112 may be coupled to a single source driver (e.g., source drivers 502, 504, 506) included in a power supply circuit assembly of the power delivery system 103. For example, in FIG. 5, each of the drivers are coupled to two coils in the planar coil region 112.

Power Delivery System Example

Figure 6:
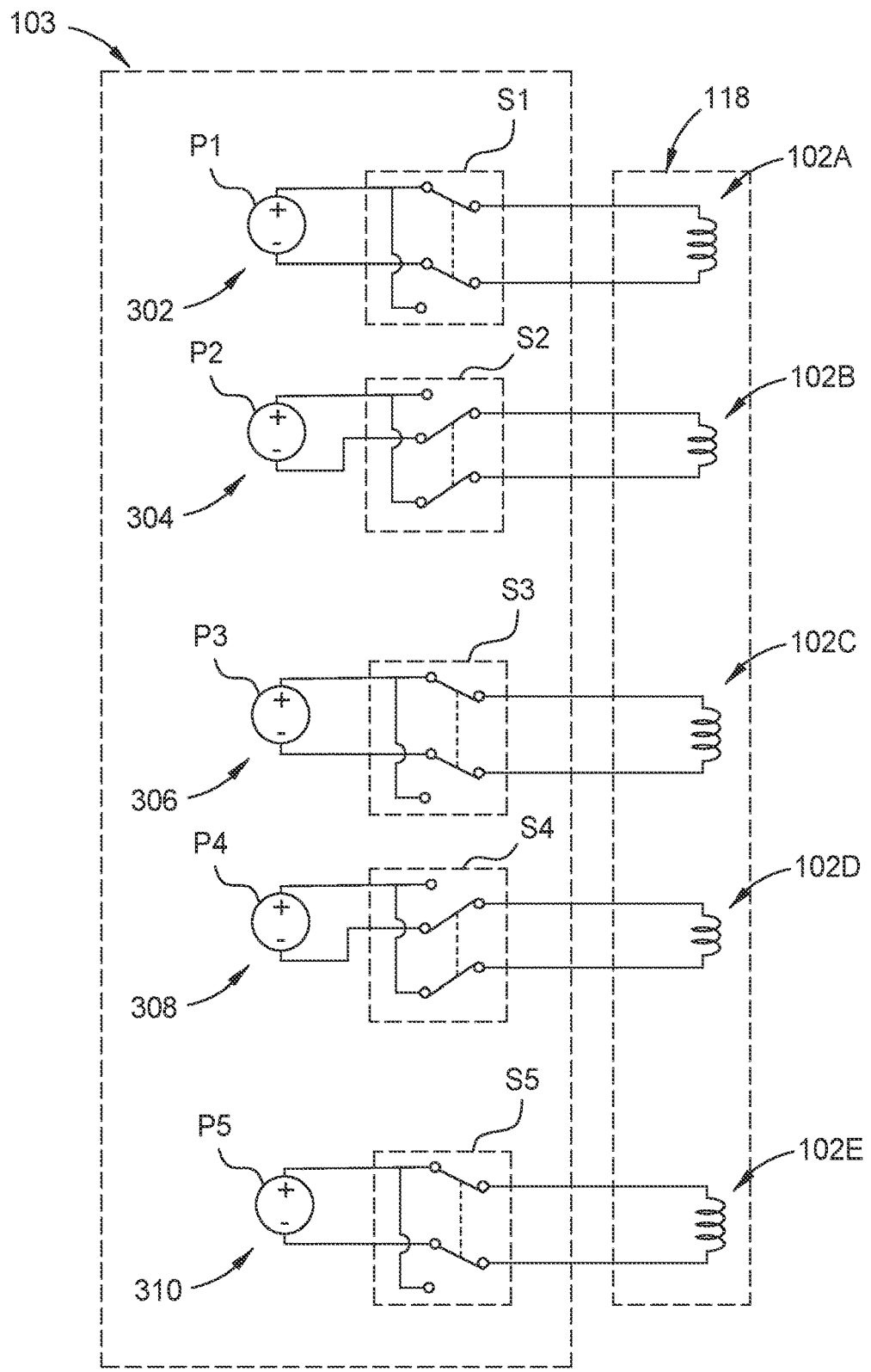
FIG. 6 is a schematic view of a power supply circuit assembly of a power delivery system of a plasma processing system, in accordance with certain embodiments of the present disclosure.

FIG. 6 is a schematic view of an example of a power delivery circuit of a power delivery system 103 of a plasma processing system 100. The power delivery system 103 may include a power supply circuit assembly. The power supply circuit assembly may include a first power supply circuit associated with the planar coil region 112 and a second power supply circuit associated with the concentric coil region 118.

The second power supply circuit may include a number of drivers (e.g., source drivers 302, 304, 306, 308, 310), each source driver being configured to bias one or more concentric coils (e.g., concentric coils 102A, 102B, 102C, 102D, 102E) in opposite directions (e.g., positive and negative directions). In other words, biasing adjacent concentric coils in opposite directions may involve reversing the direction of the current flowing through the coils as desired. Each source driver may include a power supply (e.g., power supply P1, P2, P3, P4, P5) coupled to a switch (e.g., switch S1, S2, S3, S4, S5). The switches may be double throw switches or double pulse switches, as illustrated in the example of FIG. 6. In the position illustrated in the example of FIG. 6, the source drivers 302, 306, and 310 are configured to bias the concentric coils 102A, 102C, and 102E in the concentric coil region 118 in a positive direction, while source drivers 304 and 308 are configured to bias the concentric coils 102B and 102D in the concentric coil region 118 in a negative direction. When the switches S1, S3, and S5 are flipped from the positions illustrated in FIG. 6, the source drivers are configured to bias the coils in the concentric coil region 118 in a negative direction, and switches S2 and S4 are flipped from the positions illustrated in FIG. 6 and the source drivers are configured to bias the coils in the concentric coil region 118 in a positive direction. In other words, flipping the switch of the drivers causes the current to flow in the opposite direction. The source drivers coupled to the concentric coils in the concentric coil region 118 are configured to bias adjacent concentric coils in opposite directions.

Source drivers similar to the source drivers illustrated in FIG. 6 may also be used in a similar manner to bias the coils in the planar coil region 112. For example, the first power supply circuit coupled to the planar coils in the planar coil region 112 may also include a number of drivers (e.g., source drivers 302, 304, 306, 308, 310), each source driver being configured to bias one or more planar coils (e.g., radial coils 102F, 102G, 102H, 102I, 102J, 102K) in opposite directions (e.g., positive and negative directions).

In some embodiments, the planar coils in the planar coil region 112 and the concentric coils in the concentric coil region 118 may be biased (e.g., driven) to achieve greater uniformity between the plasma 11 in the center region 160 and the outer region 170, helping to at least minimize or eliminate the effects of plasma non-uniformity on a substrate 13. The planar coils and concentric coils may be biased in a variety of ways to achieve preferred plasma uniformity, plasma density and tilt control of the generated plasma 11. The one or more source drivers coupled to the planar coils in the planar coil region 112 may be configured to bias (e.g., drive) the planar coils in the planar coil region 112 to affect the plasma 11 in the center region 160 of the plasma processing chamber 150 by changing an absolute magnitude of the current applied to the planar coils in comparison to the absolute magnitude of the current applied to the concentric coils in the concentric coil region 118 to change a radial flux in the center region 160 of the plasma processing chamber 150, as is discussed further below. Changing the radial flux in the center region 160 varies the magnetic field and the plasma density in the center region 160.

The one or more source drivers coupled to the planar coils in the planar coil region 118 may be configured to drive planar coils in the planar coil region 112 at a low frequency. For example, the drivers may apply an AC signal to the radial coils in the planar coil region 112 at a frequency of about 10 hertz (Hz) or less, such as between one and two hertz (Hz).

In some embodiments, the one or more source drivers coupled to the concentric coils in the concentric coil region 118 may be configured to bias (e.g., drive) the concentric coils in the concentric coil region 118 to affect the plasma 11 in the outer region 170 of the plasma processing chamber 150 by changing an absolute magnitude of the current applied to the concentric coils in comparison to the absolute magnitude of the current applied to the planar coils in the planar coil region 112 to change a radial flux in the outer region 170 of the plasma processing chamber 150. Changing the radial flux in the outer region 170 varies the magnetic field and the plasma density in the outer region 170.

The source drivers coupled to the concentric coils in the concentric coil region 118 may be configured to drive coils in the concentric coil region 118 with a continuous direct current (DC). For example, the source drivers may provide a continuous direct current to drive the coils in the concentric coil region 118. However, in some embodiments, it may be desirable for the drivers may apply an AC signal to the concentric coils in the concentric coil region 118 at a frequency of about 10 hertz (Hz) or less, such as between one and two hertz (Hz).

Figure 7:
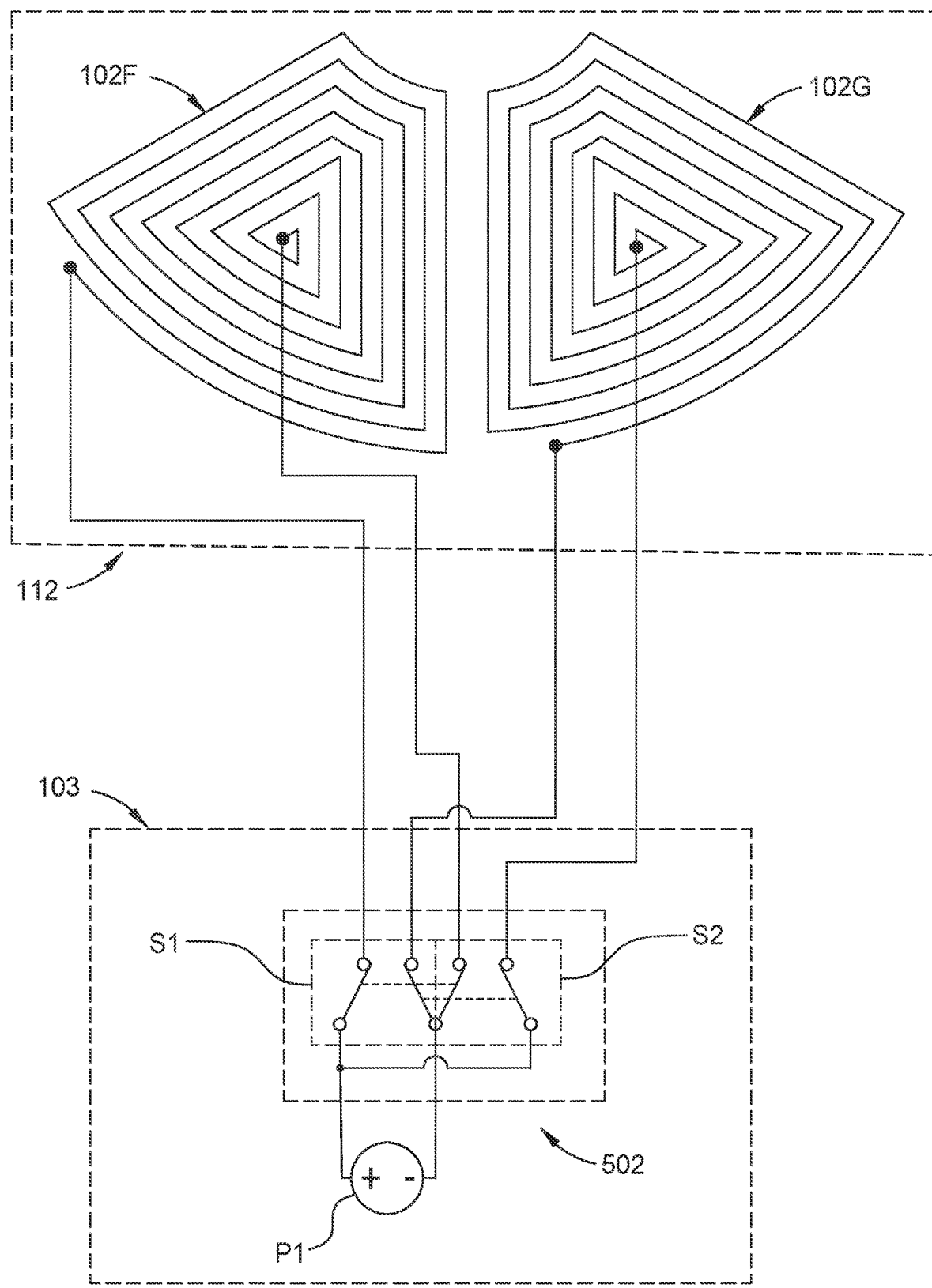
FIG. 7 is a schematic view of a power supply circuit assembly of a power delivery system of a plasma processing system, in accordance with certain embodiments of the present disclosure.

FIG. 7 is a schematic view of an example of a power supply assembly of a power delivery system 103 of a plasma processing system 100. The power delivery system 103 may include a power supply circuit assembly with a first power supply circuit. The first power supply circuit may include a source driver (e.g., source driver 502) configured to bias one or more planar coils (e.g., one or more radial coils 102F, 102G) in opposite directions. In other words, biasing adjacent concentric coils in opposite directions may involve reversing the direction of the current flowing through the coils as desired. In the example of FIG. 7, the source driver is configured to bias two planar coils of the planar coil region 112 simultaneously. In other words, three source drivers may be used to bias six planar coils in the planar coil region 112. Source drivers similar to the drivers illustrated in FIG. 7 may also be used in a similar manner to bias the multiple coils in the concentric coil region 118. For example, source driver (e.g., source driver 502) may be configured to bias one or more concentric coils (e.g., one or more concentric coils 102A, 102B, 102C, 102D, 102E) in opposite directions.

The source driver 502 may include a power supply (e.g., power supply P1) coupled to two switches (e.g., switches S1, S2). The switches may be double throw switches or double pulse switches, as illustrated in the example of FIG. 7. In the position illustrated in the example of FIG. 7, the source driver 502 is configured to bias radial coil 102F in the planar coil region 112 in a positive direction, and bias radial coil 102G in the planar coil region 112 in a negative direction. When the switches S1 and S2 are flipped from the positions illustrated in FIG. 7, the source driver 502 will be configured to bias radial coil 102F in the planar coil region 112 in a negative direction, and bias radial coil 102G in the planar coil region 112 in a positive direction. In other words, flipping the switches of the source driver 502 causes the current to flow in the opposite direction in the coils. As stated above, coils may be biased (e.g., driven) in order to achieve greater uniformity between the plasma 11 in the center region 160 and the outer region 170, helping to at least minimize or eliminate the effects of plasma non-uniformity on the substrate 13.

Processing Sequence Example

Figure 8:
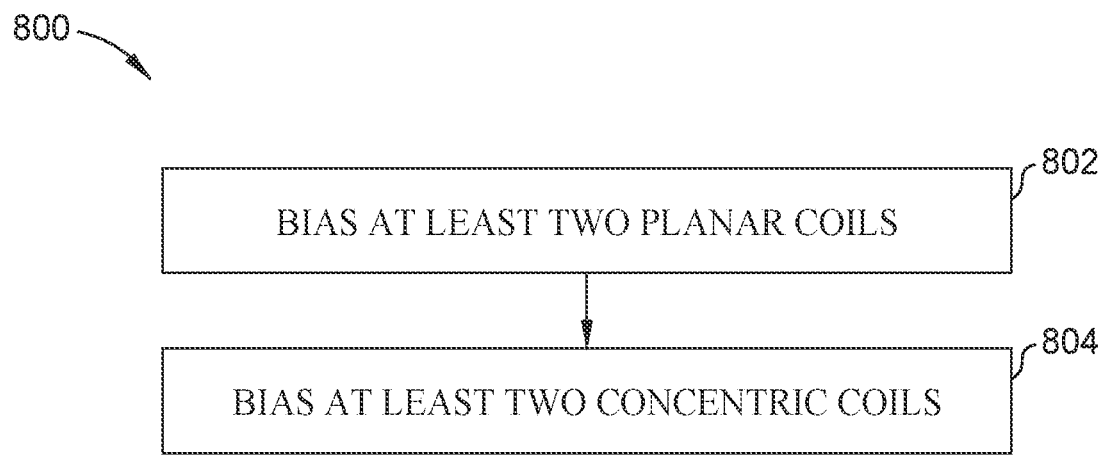
FIG. 8 is a flow diagram depicting a method for performing a plasma processing sequence, according to one or more of the embodiments described herein.
Figure 11:
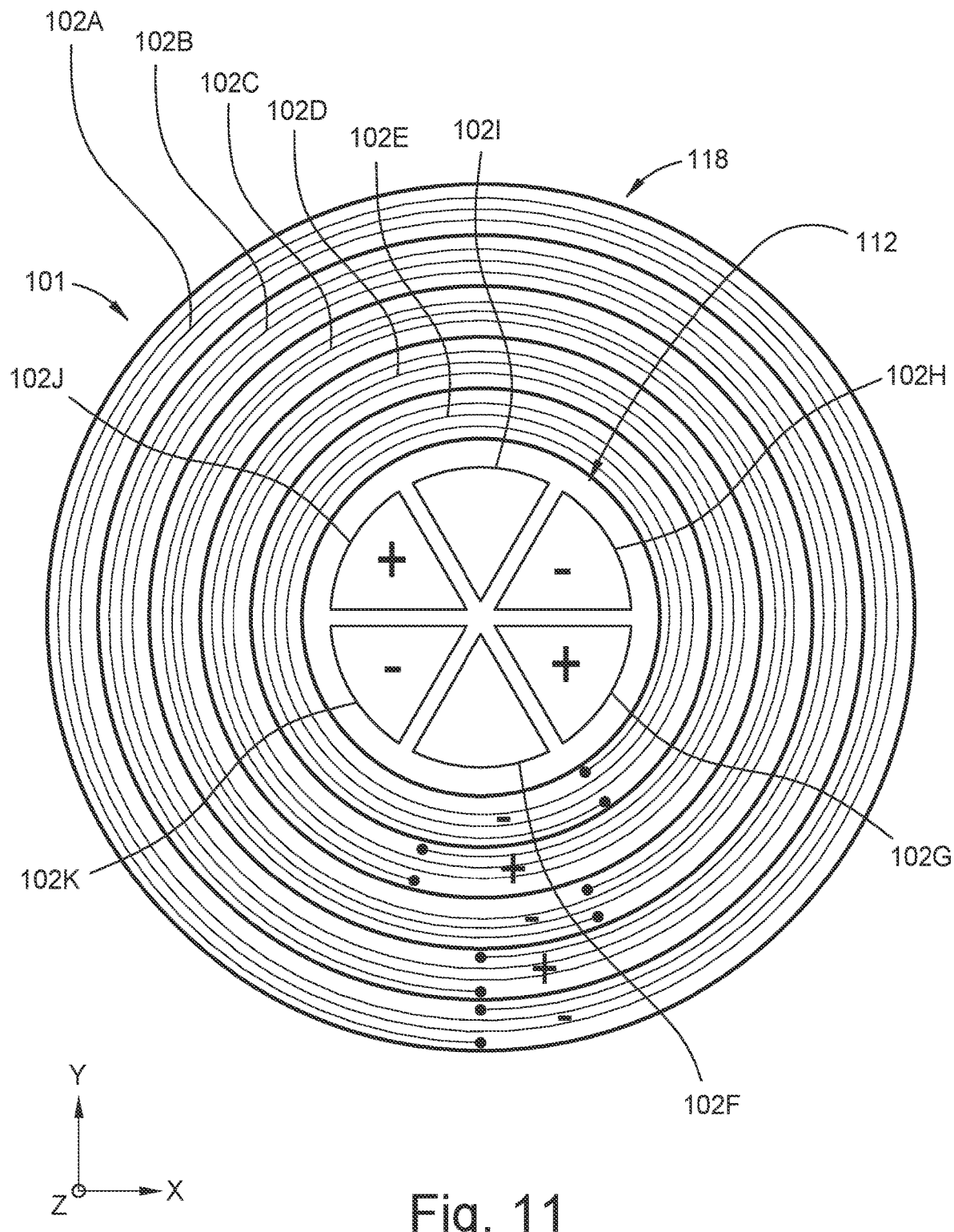
FIG. 11 is a schematic bottom view of a field generation system during a processing sequence, in accordance with certain embodiments of the present disclosure.

FIG. 8 is a flow diagram depicting a method 800 for performing a processing sequence, such as performing a processing sequence on a substrate 13 disposed within a processing volume 134 of a plasma processing chamber 150. The processing volume 134 may also be referred to as a processing region. FIGS. 9, 10, and 11 illustrate example schematic bottom views of an example field generation system 101 during one or more of the activities illustrated in FIG. 8. Therefore, FIG. 8 and FIGS. 9, 10, and 11 are herein described together for clarity.

The method 800 may begin at activity 802, where a first power supply circuit, which includes one or more of the source drivers 402, 404, 406, 408, 410, 412, 502, 504, 506, biases at least two of a plurality of planar coils of a planar coil region 112 to affect the plasma 11 in the center region 160 of the plasma processing chamber 150 by changing an absolute magnitude of a current applied to the at least two of the plurality of planar coils (e.g., two or more of radial coils 102F, 102G, 102H, 102I, 102J, 102K) in comparison to the absolute magnitude of the current applied to the at least two of the plurality of concentric coils (e.g., two or more concentric coils 102A, 102B, 102C, 102D, 102E) in the concentric coil region 118 to change a radial flux and azimuthal flux in the center region 160. Changing the radial flux and azimuthal flux in the center region 160 of the plasma 11 will vary the magnetic field and the plasma density in the center region 160.

In some embodiments, the first power supply circuit may be configured to bias adjacent planar coils in so that the current flow through the coils is in opposite directions. In some embodiments, the planar coil region comprises an even number of planar coils. Adjacent planar coils may be wound oppositely or biased oppositely to produce opposite fluxes when driven. In one example, as illustrated in FIG. 4, the radial coils are wound in the same direction, but can be biased oppositely by the source drivers to produce opposite fluxes. Alternatively, while not shown, one radial coil can be wound clockwise direction and the adjacent coil is wound in an anti-clockwise direction, such that adjacent coils produce oppositely oriented magnetic fields fluxes when biased by a source driver. In these examples, the field generation system 101 in FIG. 9 includes six planar coils in the planar coil region 112 (e.g., radial coils 102F, 102G, 102H, 102I, 102J, 102K). In one mode of operation during the method 800 for performing a processing sequence, half of the planar coils (e.g., radial coils 102G, 102I, 102K) may be biased in a positive direction, while the other half of the planar coils (e.g., radial coils 102F, 102H, 102J) may be biased in a negative direction, as illustrated in FIG. 9. In another mode of operation during the method 800 for performing a processing sequence, half of the planar coils (e.g., radial coils 102F, 102H, 102J) may be biased in a positive direction, while the other half of the planar coils (e.g., radial coils 102G, 102I, 102K) may be biased in a negative direction, as illustrated in FIG. 10.

At activity 804, a second power supply circuit (e.g., one or more of source drivers 302, 304, 306, 308, 310, 312) biases at least two concentric coils (e.g., concentric coils 102A, 102B, 102C, 102D, 102E) of a concentric coil region 118 to affect the plasma 11 in an outer region 170 of the plasma processing chamber 150. In some embodiments, the second power supply circuit may be configured to bias adjacent concentric coils in opposite directions (e.g., positive and negative directions). The second power supply circuit may be coupled to the concentric coils in the concentric coil region 118 and may be configured to bias the concentric coils in the concentric coil region 118 to affect the plasma 11 in the outer region 170 of the plasma processing chamber 150 by changing an absolute magnitude of the current applied to the concentric coils in comparison to the absolute magnitude of the current applied to the planar coils (e.g., radial coils 102F, 102G, 102H, 102I, 102J, 102K) to change a radial flux in the outer region 170 of the plasma processing chamber 150. Changing the radial flux in the outer region 170 varies the magnetic field and the plasma density in the outer region 170. In some embodiments, activity 804 may occur before activity 802. In other words, the coils in the concentric region 118 may be biased before, after, or while the coils in the planar coil region 112 are biased.

In some embodiments, as will be discussed further below, some coils may be in the off position (e.g., radial coils 102F, 102I), some coils may be biased in a positive direction (e.g., radial coils 102G, 102J), and some coils may be biased in a negative direction (e.g., radial coils 102H, 102K), as illustrated in FIG. 11. Generally, the center of each coil in the planar coil region 112 has a peak of the axial flux. As a result, cross coupling may be achieved between one pair of positive and negative biased coils (e.g., radial coils 102H, 102J) as well as between the other pair of positive and negative biased coils (e.g., radial coils 102G, 102K). This smoothing and cross coupling may help to smear the local minimum of plasma 11 at the center of each coil in the planar coil region, as well as the center region 160 of the plasma 11. In some embodiments, each coil may be controlled and manipulated in order to create a stronger magnetic field for one side of the plasma 11 when compared to the other, which may be desired if there is an issue in the plasma processing system 100 that causes non-concentricity.

In some embodiments, at least two of the plurality of planar coils in the planar coil region 112 includes multiple coil layers. At least two of the plurality of concentric coils in the concentric coil region 118 may also include multiple coil layers. The planar coil region 112 may include an even number of coils. In some embodiments, the first power supply circuit may comprise at least three power supplies (e.g., source drivers) configured to drive an even number of planar coils. The first power supply circuit may comprise a power supply (e.g., source driver) for each of the at least two of the plurality of planar coils. In some embodiments, the first power supply circuit is configured to bias the at least two of the plurality of planar coils in the planar coil region 112 by driving the at least two planar coil regions (e.g., radial coils 102F, 102G, 102H, 102I, 102J, 102K) with a low frequency, and the second power supply circuit may be configured to bias the at least two of the plurality concentric coils (e.g., concentric coils 102A, 102B, 102C, 102D, 102E) in the concentric coil region 118 by driving the at least two of the plurality of concentric coils with a continuous direct current.

In some embodiments, the at least two of the plurality of planar coils (e.g., radial coils 102F, 102G, 102H, 102I, 102J, 102K) in the planar coil region 112 may affect the plasma in the center region 160 of the plasma processing chamber through a metallic plate (e.g., shower head 230) with a low magnetic permeability, as described above with respect to FIG. 1. The at least two of the plurality of concentric coils (e.g., concentric coils 102A, 102B, 102C, 102D, 102E) in the concentric coil region 118 may affect the plasma in the outer region 170 of the plasma processing chamber through the metallic plate.

Center Region Plasma Processing Example

Figure 12:
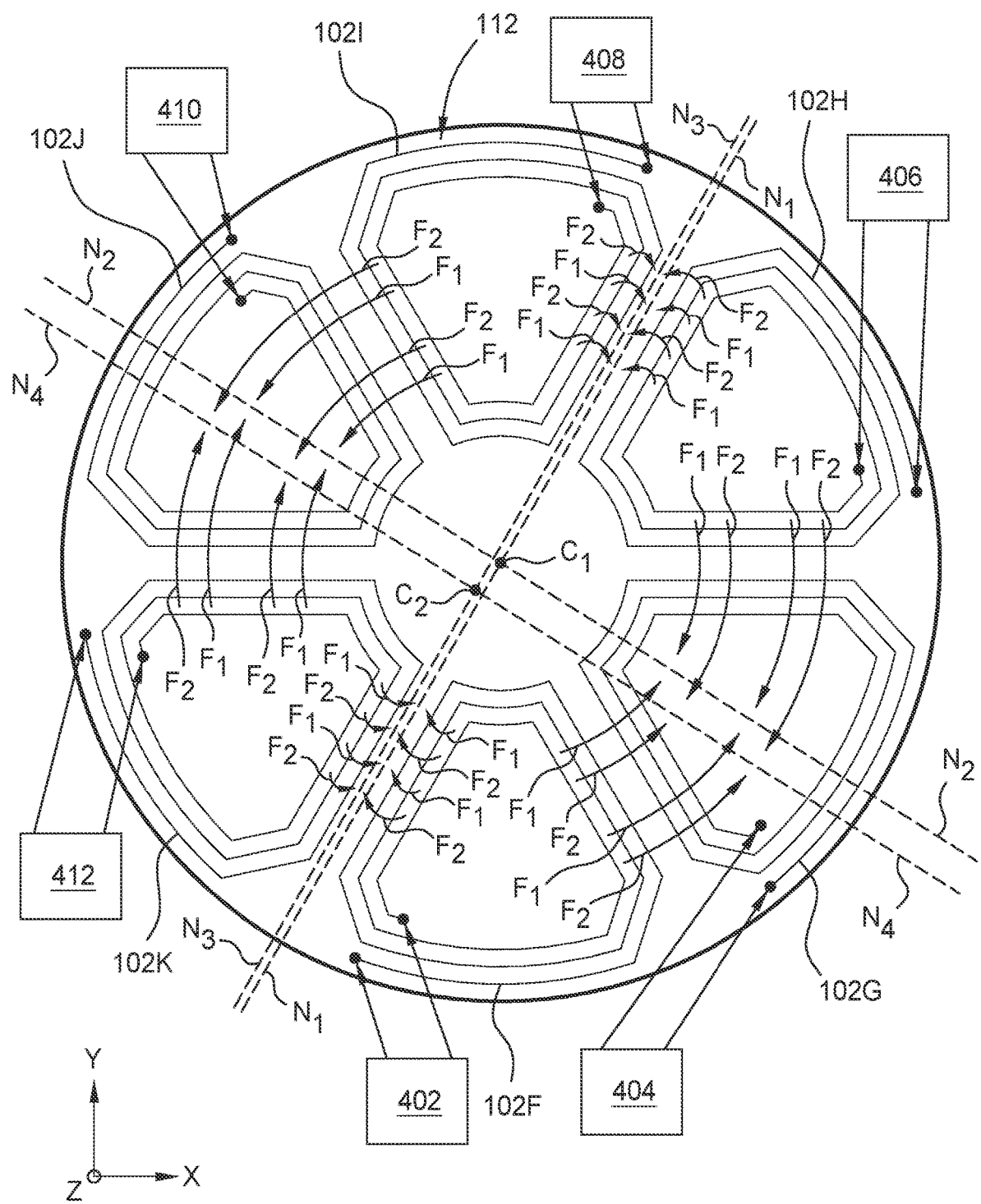
FIG. 12 is a schematic bottom view of a central region of a field generation system during a plasma processing sequence, in accordance with certain embodiments of the present disclosure.

FIG. 12 is a bottom view of a schematic bottom view of an example of the planar coil region 112, which is simplified view of the planar coil region 112 illustrated in FIG. 4. FIG. 12 is provided to help illustrate an example a method of achieving greater plasma uniformity in the center region 160 of the plasma processing chamber 150 over time by applying a bias to two or more oppositely positioned radial coils 102F-K within planar coil region 112. As noted above in activity 804 in method 800, one or more of the a second power supply circuit can also be simultaneously be used to bias at least two concentric coils within the concentric coil region 118 to affect the plasma 11 formed in the outer region 170 of the plasma processing chamber 150. However, for ease of discussion, the discussion of the control of the concentric coil region 118 components has been purposefully been left out below and only a discussion of the plasma uniformity control within the center region 160 is discussed herein. In this example, at a first time $T_1$ a first bias is applied to radial coils 102F, 102H, 102I and 102K by the source drivers 402, 406, 408, and 412, respectively. The first bias may include a uniform bias voltage being applied to all of the coils 204A in the radial coils 102F, 102H, 102I and 102K. In this case, the magnetic field lines $F_1$ generated by the current flowing through the coils 204A within radial coils 102F, 102H, 102I and 102K will form null regions $N_1$ and $N_2$, along which the magnetic field is effectively at a minimum. As shown, due to the symmetric arrangement of the coil regions and symmetric bias applied, the null regions $N_1$ and $N_2$ are symmetrically aligned between the biased radial coils 102F, 102H, 102I and 102K, and will include a null point $C_1$ at the center of the planar coil region 112. The null point $C_1$, which coincides with a point where the null regions $N_1$ and $N_2$ cross, will undesirably form a low plasma density region over the center of a substrate disposed within the processing volume 134 of the plasma processing chamber 150.

However, it has been found that by applying a second bias at a second time $T_2$ that is not uniformly applied to all of the radial coils 102F, 102H, 102I and 102K, the null regions and null point can be shifted relative to the center of the processing volume and/or null regions and null point formed at the first time $T_1$. As schematically shown in FIG. 12, by increasing the bias, and thus current flow through one or more of the coil regions (e.g., radial coils 102H and 102I), the null regions and null point can be shifted to a different orientation from the null regions and null point created at the first time $T_1$. In this example, at time $T_2$, the magnetic field lines $F_2$ generated by the non-symmetric current flow through the coils 204A within radial coils 102F, 102H, 102I and 102K form null regions $N_3$ and $N_4$ and null point $C_2$. Therefore, by use of the controller 126 and software programs stored in memory 128 the current flowing through each of the radial coils 102F, 102G, 102H, 102I, 102J, 102K can be adjusted over time so that the null regions and null point can be shifted over time relative to the X-Y plane that is parallel to a surface of a substrate disposed within the processing volume of the plasma processing chamber. The ability to adjust the position of the null regions and null point over time is thus used to blur and even out the effect of the formation of the null regions and null point on the plasma density formed over the surface of the substrate that is being processed in the plasma processing chamber.

In some embodiments, two or more different adjacent pairs of coil regions are sequentially biased over time to cause the null regions and null point to translate around a symmetric center of the plasma processing chamber. In one example, a first adjacent opposing pairs of coil regions, such as a first pair of coil regions (e.g., radial coils 102H and 102K) and a second pair of coil regions (e.g., radial coils 102F and 102I) are each biased at a first time, and then a second adjacent opposing pairs of coil regions, such as a third pair of coil regions (e.g., radial coils 102G and 102J) and the second pair of coil regions (e.g., radial coils 102F and 102I) are each biased at a second time, and then a third adjacent opposing pairs of coil regions, such as a third pair of coil regions (e.g., radial coils 102G and 102J) and the first pair of coil regions (e.g., radial coils 102H and 102K) are each biased at a third time. Thus, a sequence of applying a bias to adjacent pairs of the coil regions (e.g., radial coils 102F and 102G) or two adjacent opposing pairs of coil regions (e.g., first pair of radial coils 102H and 102K and second pair of radial coils 102F and 102I) and then shifting to the next adjacent pairs of the coil regions (e.g., radial coils 102G and 102H) or two adjacent opposing pairs of coil regions (e.g., second pair of radial coils 102F and 102I and third pair of radial coils 102G and 102J) and so on can be performed sequentially multiple times during a plasma process, and thus used to blur and even out the effect of the formation of the null regions and null point on the plasma density formed over the surface of the substrate. In another example, a sequence of applying a bias to two adjacent opposing pairs of coil regions, then shifting to the next two adjacent opposing pairs of coil regions and then shifting to the next two adjacent opposing pairs of coil regions and so on is performed sequentially multiple times in a clockwise or counter-clockwise direction about a central axis of the planar coil region 112 during a plasma process.

ADDITIONAL CONSIDERATIONS

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A plasma processing chamber, comprising:
a planar coil region comprising a plurality of planar coils, wherein
each of the plurality of planar coils comprises a coil that includes a first end and a second end,
wherein the plurality of planar coils are arranged in a circular array centered about a first point and are adjacently positioned in a first plane,
each of the plurality of planar coils includes a center point disposed a distance from the first point, and
each of the plurality of planar coils has a first portion that is aligned parallel to the first plane;
a first power supply circuit coupled to at least two of the plurality of planar coils, wherein the first power supply circuit is configured to bias at least two of the plurality of planar coils to affect a plasma formed in a center region of the plasma processing chamber;
a concentric coil region comprising a first concentric coil and a second concentric coil, wherein
at least a portion of the planar coil region is surrounded by the first concentric coil and the second concentric coil,
the first concentric coil comprises a first coil that has a first diameter that is measured in a direction parallel to the first plane,
the second concentric coil comprises a second coil that has a second diameter that is measured in a direction parallel to the first plane,
the first concentric coil and the second concentric coil have a central axis that includes the first point, and
the first diameter is smaller than the second diameter; and
a second power supply circuit coupled to the first concentric coil and the second concentric coil, wherein the second power supply circuit is configured to bias the first concentric coil and the second concentric coil to alter a characteristic of the plasma formed in an outer region of the plasma processing chamber.

2. The plasma processing chamber of claim 1, wherein:
each of the plurality of planar coils comprises multiple coil layers, wherein each of the multiple coil layers is aligned parallel to the first plane; and
each of the first concentric coil and the second concentric coil comprises multiple coil layers.

3. The plasma processing chamber of claim 1, wherein:
the first power supply circuit is further configured to bias adjacent planar coils in opposite directions; and
the second power supply circuit is further configured to bias adjacent concentric coils in opposite directions.

4. The plasma processing chamber of claim 1, wherein:
the planar coil region comprises an even number of planar coils; and
adjacent planar coils are wound oppositely to produce opposite fluxes when driven.

5. The plasma processing chamber of claim 4, wherein the first power supply circuit comprises at least three drivers configured to drive the even number of planar coils.

6. The plasma processing chamber of claim 1, wherein the first power supply circuit comprises a driver for each of the plurality of planar coils.

7. The plasma processing chamber of claim 1, wherein:
the first power supply circuit is configured to bias the at least two of the plurality of planar coils by driving the at least two of the plurality of planar coils with a low frequency; and
the second power supply circuit is configured to bias the first concentric coil and the second concentric coil by driving the first concentric coil and the second concentric coil with a continuous direct current.

8. The plasma processing chamber of claim 1, wherein:
the first power supply circuit is configured to bias the at least two of the plurality of planar coils to affect a plasma in a center region of the plasma processing chamber by changing an absolute magnitude of a current applied to the at least two of the plurality of planar coils in comparison to the absolute magnitude of the current applied to the first concentric coil and the second concentric coil to change a radial flux in the center region; and changing the radial flux in the center region varies a magnetic field and a plasma density in the center region.

9. The plasma processing chamber of claim 1, wherein:
the second power supply circuit is configured to bias the first concentric coil and the second concentric coil to affect a plasma in an outer region of the plasma processing chamber by changing an absolute magnitude of a current applied to the first concentric coil and the second concentric coil in comparison to the absolute magnitude a current applied to the at least two of the plurality of planar coils to change a radial flux in the outer region; and
changing the radial flux in the outer region varies a magnetic field and a plasma density in the outer region.

10. The plasma processing chamber of claim 1, wherein:
the at least two of the plurality of planar coils affect the plasma in the center region of the plasma processing chamber through a metallic plate with a high magnetic permeability; and
the first concentric coil and the second concentric coil affect the plasma in the outer region of the plasma processing chamber through the metallic plate.

11. A plasma processing chamber, comprising:
a planar coil region comprising a plurality of planar coils, wherein each of the plurality of planar coils comprises a coil that is disposed between a first end and a second end and has a first portion that is aligned parallel to a first plane, wherein
the plurality of planar coils are arranged in a circular array centered about a central axis, and
the plurality of planar coils in the circular array being azimuthally and adjacently positioned;
a first power supply circuit coupled to at least two of the plurality of planar coils, wherein the first power supply circuit is configured to bias at least two of the plurality of planar coils to affect a plasma formed in a center region of the plasma processing chamber;
a concentric coil region comprising a first concentric coil and a second concentric coil, wherein
at least a portion of the planar coil region is surrounded by the first concentric coil and the second concentric coil,
the first concentric coil comprises a first coil that has a first diameter that is measured in a direction parallel to the first plane,
the second concentric coil comprises a second coil that has a second diameter that is measured in a direction parallel to the first plane,
the first concentric coil and the second concentric coil being centered about the central axis,
the first concentric coil and the second concentric coil are wound around the central axis, and
the first diameter is smaller than the second diameter; and
a second power supply circuit coupled to the first concentric coil and the second concentric coil, wherein the second power supply circuit is configured to bias the first concentric coil and the second concentric coil to alter a characteristic of the plasma formed in an outer region of the plasma processing chamber.

12. The plasma processing chamber of claim 11, wherein:
each of the plurality of planar coils comprises multiple coil layers, wherein each the multiple coil layers is aligned parallel to the first plane; and
each of the first concentric coil and the second concentric coil comprises multiple coil layers.

13. The plasma processing chamber of claim 11, wherein:
the first power supply circuit is further configured to bias adjacent planar coils in opposite directions; and
the second power supply circuit is further configured to bias adjacent concentric coils in opposite directions.

14. The plasma processing chamber of claim 11, wherein:
the planar coil region comprises an even number of planar coils; and
adjacent planar coils are wound oppositely to produce opposite fluxes when driven.

15. The plasma processing chamber of claim 11, wherein:
the first power supply circuit is configured to bias the at least two of the plurality of planar coils by driving the at least two of the plurality of planar coils with a low frequency; and
the second power supply circuit is configured to bias the first concentric coil and the second concentric coil by driving the first concentric coil and the second concentric coil with a continuous direct current.

16. The plasma processing chamber of claim 11, wherein:
the first power supply circuit is configured to bias the at least two of the plurality of planar coils to affect a plasma in a center region of the plasma processing chamber by changing an absolute magnitude of a current applied to the at least two of the plurality of planar coils in comparison to the absolute magnitude of the current applied to the first concentric coil and the second concentric coil to change a radial flux in the center region; and
changing the radial flux in the center region varies a magnetic field and a plasma density in the center region.

17. The plasma processing chamber of claim 11, wherein:
the second power supply circuit is configured to bias the first concentric coil and the second concentric coil to affect a plasma in an outer region of the plasma processing chamber by changing an absolute magnitude of a current applied to the first concentric coil and the second concentric coil in comparison to the absolute magnitude a current applied to the at least two of the plurality of planar coils to change a radial flux in the outer region; and
changing the radial flux in the outer region varies a magnetic field and a plasma density in the outer region.

* * * * *